United States Patent [19]
Schumer

[11] 3,749,347
[45] July 31, 1973

[54] MOUNTING ELEMENT FOR ELECTRICAL COMPONENTS

[75] Inventor: Henry A. Schumer, Beverly Hills, Calif.

[73] Assignee: Angstrohm Precision Incorporated, Van Nuys, Calif.

[22] Filed: Sept. 2, 1971

[21] Appl. No.: 177,375

[52] U.S. Cl. .................................. 248/309, 338/252
[51] Int. Cl. .............................................. H05k 5/04
[58] Field of Search ................. 248/309; 174/52 PE, 174/52 S; 338/315, 317, 85, 252; 339/125

[56] References Cited

UNITED STATES PATENTS

| | | | |
|---|---|---|---|
| 3,416,048 | 12/1968 | Spickenreuther | 174/52 S X |
| 3,200,359 | 8/1965 | Hulbert | 338/315 X |
| 2,782,371 | 2/1957 | Lamb | 174/52 S X |
| 3,449,506 | 6/1969 | Weinstein et al. | 174/52 S |

*Primary Examiner*—J. Franklin Foss
*Attorney*—Bernard Malina

[57] ABSTRACT

A mounting element for aligning an electrical component so that it is parallel with the plane of the circuit board (or chassis) on which it is contained. The mounting element includes a shank, an intermediate flat shoulder, and a post extending upright from the shoulder. The shank is inserted through a hole in the board and is fastened to the board so that the underside of the shoulder lies flat against the board. The component to be mounted includes a bore in its underside which mates with the upright post of the mounting element. The component can be mounted on the post with a press-fit or cemented thereto, so that it lies on the shoulder in a plane parallel with that of the board.

18 Claims, 6 Drawing Figures

PATENTED JUL 31 1973 3,749,347

INVENTOR.
HENRY A. SCHUMER
BY
Bernard Malina
ATTORNEY

MOUNTING ELEMENT FOR ELECTRICAL COMPONENTS

This invention relates to mounting elements for electrical components, and more particularly to an element for mounting a trimmable resistor or capacitor in a plane which is parallel to a circuit board or electrical chassis.

In U.S. Pat. No. 3,469,226 issued to B. Solow on Sept. 23, 1969, there is disclosed a trimmable thin-film resistor. The resistor is provided with an electrically insulating body having an elongated groove formed in its upper surface, with a film of resistor material disposed within the groove. A pair of terminals are located on the insulating body and in electrical contact with the resistor film. The structure is encapsulated within a suitable protective material. To adjust the value of the resistance, a portion of the resistor film is removed to increase its resistance, for example, by grinding away a portion of the protective material covering the groove and the ceramic body bearing the resistive film and the film itself are simultaneously removed to make the resistance path narrower and hence, the resistance higher. In practice, the device can be connected to an ohmmeter or other resistance measuring instrument while the resistive material is being removed, so that the adjustment can be stopped when the desired value of resistance is achieved. Alternatively, the resistor can be adjusted while it is in circuit to thereby trim a particular circuit parameter dependent upon the resistance value. Once the desired value is attained, a protective material is coated or otherwise applied to the edges of the film exposed by the adjustment operation to complete its encapsulation.

Although the Solow resistor and other electrical components can be adjusted relatively simply when they are not connected in a circuit, it is more difficult to adjust them when they are mounted on an electrical chassis or on a circuit board. In the case of the Solow trimmable resistor, for example, the component should be mounted with its resistive film facing upward so that access can be had to the film for grinding away some of its material. When the resistor is to be adjusted by automated equipment after it is connected to a circuit board, it is especially desirable that the component be parallel with the plane of the circuit board so that all boards "look alike" to the equipment, and so that a grinding wheel surface can be located parallel to the upper surface of the resistor or capacitor.

It is a general object of my invention to provide an element which, in cooperation with an electrical component, insures that the electrical component is held in a plane parallel with a circuit board or an electrical chassis.

In accordance with the principles of my invention, I provide a mounting element which comprises three parts — a shank, a flat shoulder attached to the shank in a plane perpendicular to the shank axis, and an upright post extending from the shoulder in a direction opposite to that of the rivet. The shank can be placed into an aperture in the circuit board (or chassis) with the underside of the shoulder pressing against the upper surface of the board. The end of the shank extending through the board is then fastened to the board so that the shoulder bears tightly against the board, with the upright post extending upward away from the shoulder. The electrical component is provided with a bore which mates with the upright post. The bore is in the flat underside of the component and has dimensions such that it can be press-fitted or cemented upon the male post. When pressed down, the flat underside of the component bears against the flat shoulder of the mounting element and thus the component is held parallel with the board, either by virtue of the press-fit or by the cementing to the shoulder and/or upright post.

It is a feature of my invention to provide a mounting element for an electrical component, the mounting element including a shank section for attachment to a circuit board or electrical chassis, an intermediate flat shoulder for supporting the component, and a post extending upright from the shoulder for press-fit or cementing after insertion into a mating bore in the underside of the component.

Further objects, features and advantages of my invention will become apparent upon consideration of the following detailed description in conjunction with the drawing, in which.

Figures 1, 2, 3, 4, 5, 6:
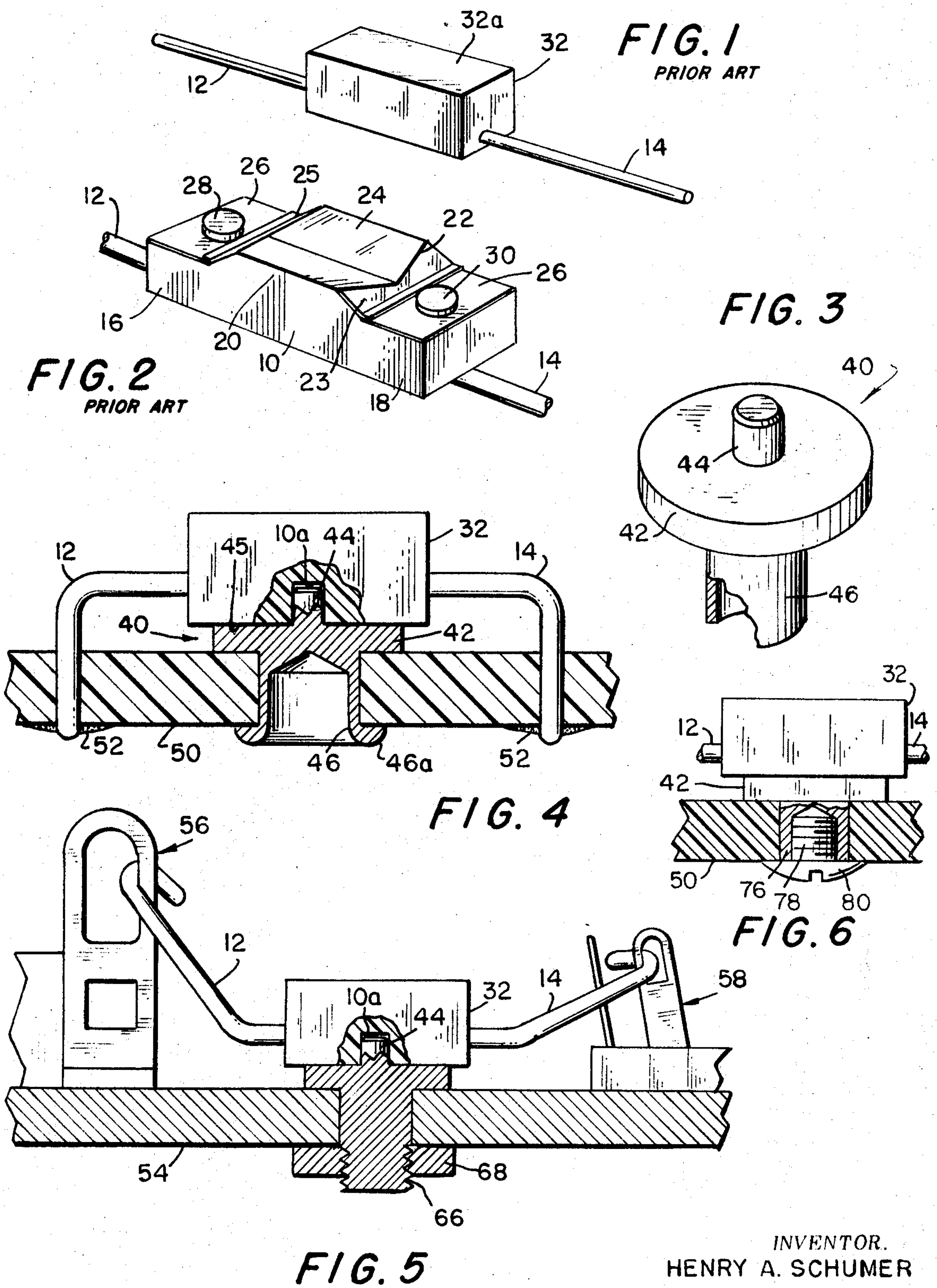
FIG. 1 is similar to FIG. 1 in the above-identified Solow patent and is a greatly enlarged pictorial view of the Solow trimmable resistor.
FIG. 2 is similar to FIG. 2 in the Solow patent and is a greatly enlarged pictorial view of the Solow trimmable resistor with its casing removed.
FIG. 3 is a perspective view, shown partially broken away, of the mounting element of my invention, in one embodiment thereof.
FIG. 4 is a sectional view, shown partially broken away, depicting the manner in which the component of FIG. 1 can be mounted by the element of FIG. 3 to a circuit board.

FIG. 5 is a sectional view, shown partially broken away, depicting the manner in which the component of FIG. 1 can be mounted by the element of the present invention in a second embodiment thereof to an electrical chassis, and FIG. 6 is a fragmented sectional view depicting the manner in which the component of FIG. 1 can be mounted by the element of the present invention in a third embodiment thereof to a circuit board.

Referring to FIGS. 1 and 2 for an understanding of the Solow trimmable resistor, a generally rectangular body 10 of electrically insulating material, such as ceramic or glass, has a pair of leads 12 and 14 secured in respective opposite end portions 16 and 18, and a pedestal or raised portion 20 disposed on one surface of body 10 between end portions 16 and 18. The ends of pedestal portion 20 confronting end portions 16 and 18 can have chamfered surfaces, such as surfaces 23 and 25. A groove 22 of V-shaped cross-section is formed in pedestal portion 20, extending between end portions 16 and 18. The slope of the groove is selected to provide a predetermined degree of resistance change for a given removal of resistive film.

The resistive path is composed of a film 24 of resistive material deposited onto the surface of groove 22, onto chamfered surfaces 23 and 25, and at least partially onto the upper surfaces of end portions 16 and 18, over which a conductive film has been formed. The outermost edges of resistive film 24 are substantially flush with the outermost edges of pedestal portion 20. A conductive layer 26, for example, of gold, is formed on the upper surfaces of each of end portions 16 and 18, and each end of resistive film 24 is formed over a portion of one of layers 26. Lead wires 12 and 14 are electrically connected to the resistive path by means of respective lead wires 28 and 30 which are secured to conductive layers 26, for example, by conductive cement.

Body 10 and a portion of leads 12 and 14 are encapsulated in a casing 32 of suitable insulating material, such as epoxy, as shown in FIG. 1. As in the Solow patent, the magnitude of the resistance offered by the film can be adjusted, while the casing 32 is removed, by grinding along with the portion of substrate 32 and resistive material 24 while at the same time measuring the resistance by placing an ohmmeter across leads 12 and 14. The grind is parallel to the face 32$a$ and may be accomplished by using a large grinding wheel or a surface grinder (not shown) in order to provide parallel grinding.

While the Solow resistor, and similar components, can be adjusted relatively simply before they are connected in a circuit, after they are attached to a circuit board or an electrical chassis it may be difficult to adjust their impedance magnitudes. The major difficulty is that the component is not necessarily constrained to a plane parallel with that of the board, even with deliberate and time-consuming efforts on the part of those persons on the assembly line who mount the elements, since the electrical component could shift out of parallel during the grinding operation.

But an electrical component such as that shown in FIGS. 1 and 2 can be mounted so that it is held flat relative to a circuit board with the use of the mounting element of FIG. 3, provided that the component has a bore in its underside which mates with the post included on the mounting element.

The mounting element 40 of the present invention comprises three sections, namely an uppermost post 44, on intermediate flat shoulder 42 and a lower shank section for securing mounting element 40 to the circuit board 50 so that shoulder 42 rests flat against the top surface of the board 50. In one illustrative embodiment, as shown in FIGS. 3 and 4, the lower shank section of mounting element 40 comprises a rivet section 46 and a cylindrical post 44. Before mounting the electrical component to circuit board 50 (FIG. 4), the mounting element is first secured to the board. Rivet 46 is inserted through a hole in the board from the direction of its upper surface. The lower end 46$a$ of the rivet is then swaged as shown in FIG. 4 so that the mounting element is tightly secured to the board with shoulder 42 resting flat against the top of the board. Body 10 of the component includes a circular bore 10$a$ in its underside such that the component can be press-fitted upon post 44 extending upright from shoulder 42. Simply by pressing the component down against the mounting element, the component is forced to lie in a plane which is parallel with that of the board. The two leads 12 and 14 can then be attached by solder 52 to holes in the circuit board in the conventional manner.

FIG. 5 shows the use of a second illustrative embodiment of the mounting element of the present invention on an electrical chassis 54 which includes a tie lug 56 and a socket 58. In the embodiment of FIG. 5, the lower shank section of the mounting element comprises a shank 66 externally threaded at the lower end thereof for threaded engagement with a companion unit 68 to secure shoulder 42 tightly against the top surface of chassis 54. The two leads of the component may be attached to the tie lug and socket in any conventional manner. As in the case of the circuit board, the use of the mounting element insures that the electrical component is held fixed in a plane parallel with the board. In this way, adjustment of the resistance value can be accomplished easily on a production line even after the component is connected in a circuit, by means of a diamond grinding tool of sufficiently small diameter to clear tie lug 56 and socket lug 58.

In a third embodiment of the mounting of the present invention, as shown in FIG. 6, the shank section comprises a tapped shank 76 for threaded engagement with a screw 78 through the underside of circuit board 50. Thus, screw 78 may be fastened into tapped shank 76 so that screw head 80 bears against the underside of board 50 to secure shoulder 42 tightly against the top surface of board 50.

In the above-described embodiments of FIGS. 4 – 6, post 44 and bore 10$a$ may be suitably dimensioned to provide a loose fit rather than a press fit and a layer of cement or glue 45 may be applied on the top surface 42$a$ of shoulder 42 and around post 44 to cement component 32 to mounting element 40 and thereby fixedly secure shoulder 42 tightly against the top surface of board 50.

Furthermore, in FIGS. 3 – 6, although a circular cross-section of post 44 and shoulder 42 is preferred, either or both post 44 and shoulder 42 may be rectangular in cross-section, as desired.

Although the invention has been described with reference to particular embodiments, it is to be understood that these embodiments are merely illustrative of the applicaton of the principles of the invention. Numerous modifications may be made therein and other arrangements may be devised without departing from the spirit and scope of the invention.

What I claim is:

1. An element for mounting an electrical component requiring in-circuit adjustment to a support such as a circuit board, electrical chassis or the like, said electrical component having a flat underside with a bore therein, comprising attachment means, Intermediate shoulder means having two opposite surfaces, and a post, said attachment means and post extending away from opposite surfaces of said shoulder means, said attachment means being adapted for attachment to said support for causing the respective surface of said shoulder means to bear against a surface of said support, said post being configured for fitting engagement with the bore in said component for controlling the flat underside of said component to bear against the respective surface of said shoulder means.

2. An element in accordance with claim 1 wherein said intermediate shoulder means comprises a shoulder section having two flat parallel surfaces.

3. An element in accordance with claim 2 wherein said attachment means comprises a rivet section being adapted for insertion into an aperture in said support for causing the respective surface of said shoulder section to bear against a surface of said support.

4. An element in accordance with claim 2 wherein said attachment means comprises a tapped shank section for insertion into an aperture in said support and a head screw fastened to said shank section for causing the respective surface of said shoulder section to bear against a surface of said support.

5. An element in accordance with claim 2 wherein said attachment means comprises an externally threaded shank section and a nut for threaded engagement with said threaded shank section for causing the respective surface of said shoulder section to bear against a surface of said support.

6. An element in accordance with claim 2 wherein said post is configured for press fitting engagement with said component bore.

7. An element in accordance with claim 2 wherein said post is configured for adhesive fastening to the surface of said component bore.

8. An element In accordance with claim 2 wherein said post is cylindrical.

9. An element in accordance with claim 2 wherein sald post is rectangular in cross-section.

10. An electrical component-mounting system comprising an electrical component requiring in-circuit adjustment and an element for mounting said electrical component to a support such as a circuit board, electrical chassis or the like, said electrical component having a flat underside with a bore therein, said element having an attachment means, an intermediate shoulder section having two flat parallel surfaces, and a post, said shank section and post extending away from opposite surfaces of said shoulder section, said attachment means being adapted for attachment to said support for causing the respective surface of said shoulder section to bear against a surface of said support, said post being configured for fitting engagement with the bore in said component for controlling the flat underside of said component to bear against the respective flat surface of said shoulder section.

11. An electrical component-mounting system in accordance with claim 10 wherein said electrical component is a trimmable resistor.

12. An electrical component-mounting system in accordance with claim 10 wherein said electrical component is a trimmable capacitor.

13. An electrical component-mounting system in accordance with claim 10 wherein said attachment means comprises a rivet section being adapted for insertion into an aperture in said support for causing the respective surface of said shoulder section to bear against a surface of said support.

14. An electrical component-mounting system in accordance with claim 10 wherein said attachment means comprises a tapped shank section for insertion into an aperture in said support and a head screw fastened to said shank section for causing the respective surface of said shoulder section to bear against a surface of said support.

15. An electrical component-mounting system in accordance with claim 10 wherein said attachment means comprises an externally threaded shank section.

16. An electrIcal component-mounting system in accordance with claim 10 wherein said post Is press fit in said component bore.

17. An electrical component-mounting system in accordance with claim 10 wherein said post is adhesively fastened to the surface of said component bore.

18. An electrical component-mounting system in accordance with claim 10 wherein the surface of said shoulder section opposite to the surface thereof bearing against said support is adhesively fastened to said electrical component.

* * * * *